United States Patent [19]

Misium

[11] Patent Number: 5,753,420
[45] Date of Patent: May 19, 1998

[54] ROUGH DIELECTRIC FILM BY ETCHBACK OF RESIDUE

[75] Inventor: George R. Misium, Plano, Tex.

[73] Assignee: Texas Instruments Incorporated, Dallas, Tex.

[21] Appl. No.: 713,338

[22] Filed: Sep. 13, 1996

Related U.S. Application Data

[60] Provisional application No. 60/003,862, Sep. 18, 1995.

[51] Int. Cl.$^6$ .......................................... G03F 7/00
[52] U.S. Cl. ..................... 430/313; 430/319; 430/330
[58] Field of Search .................................. 430/311, 313, 430/314, 319, 323, 324, 325, 329, 330, 396

[56] References Cited

U.S. PATENT DOCUMENTS 5,411,911   5/1995   Ikeda .................................. 437/52
5,562,801  10/1996   Nulty ................................ 156/643.1

Primary Examiner—Kathleen Duda
Attorney, Agent, or Firm—Jacqueline J. Garner; W. James Brady, III; Richard L. Donaldson

[57] ABSTRACT

A capacitor and method of forming the capacitor for high density applications. The capacitor (100) comprises a storage node (106) having peaks (108) formed on a surface thereof. The peaks (108) are created by forming a photoresist residue layer (130) on the polysilicon layer of the storage node (108). The structure is then dry etched using the residue layer (130) as a mask to create peaks (108).

14 Claims, 3 Drawing Sheets

5,753,420

ROUGH DIELECTRIC FILM BY ETCHBACK OF RESIDUE

This application claims priority under 35 USC & 119 (e) (1) of provisional application Ser. No. 60,003,862, filed Sep. 18, 1995.

FIELD OF THE INVENTION

This invention generally relates to high density memory devices and more specifically to capacitor structures in such devices.

BACKGROUND OF THE INVENTION

One common high density memory is the Dynamic random access memory (DRAM). DRAMs comprise an array of individual cells for storing information. The most common cell configuration consists of one transistor 12 and one capacitor 14 as shown in FIG. 1. The transistor 12 is a pass transistor and is connected between a bitline 16 and the capacitor 14. The pass transistor 12 is gated by a wordline signal 18. A bit of information is stored on the capacitor 14 and is read from the cell to the associated bitline or written to the cell from the bitline through pass transistor 12.

As the density of the memory devices increases, it becomes more difficult to achieve sufficient cell capacitance in the smaller area allotted for each cell. Various methods have been developed to increase the surface area of the bottom node of the capacitor. One prior art method deposits a thin layer of hemispherical grain silicon, "rugged poly", over the polysilicon bottom node to increase surface area. However, simpler processes and additional increases in capacitance per given area are still desired.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a capacitor for a DRAM cell. Those of ordinary skill in the art of high density devices such as DRAMs will recognize that the capacitor of the invention may also be used in conjunction with other high density applications.

Figure 1:
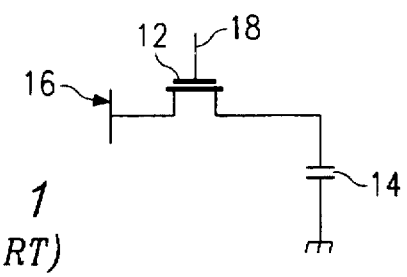
FIG. 1 is a schematic diagram of a prior art DRAM cell.
Figure 2:
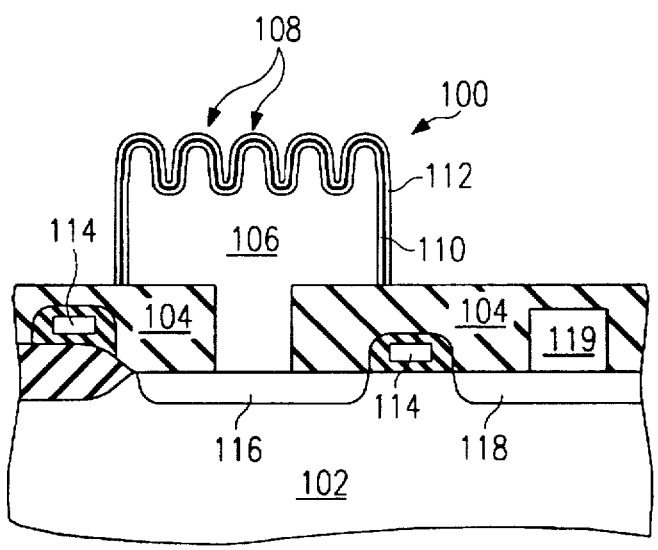
FIG. 2 is a cross-sectional view of a DRAM capacitor according to the invention.

A capacitor 100 according to a first embodiment of the invention is shown in FIG. 2. Capacitor 100 contacts semiconductor body 102 through an interlevel dielectric layer 104. The storage node 106 of capacitor 100 comprises doped polysilicon. Storage node 106 comprises peaks 108 that provide a significant increase in surface area of the storage node 106. For example, an increase in surface area on the order of 5× can be obtained. The increase in surface area corresponds directly to an increase in capacitance. A capacitor dielectric 110 separates the storage node 106 of capacitor 100 from the top node 112. The capacitor dielectric 110 may, for example, comprise a nitride-oxide bilayer and the top node 112 preferably comprises doped polysilicon.

Figure 3:
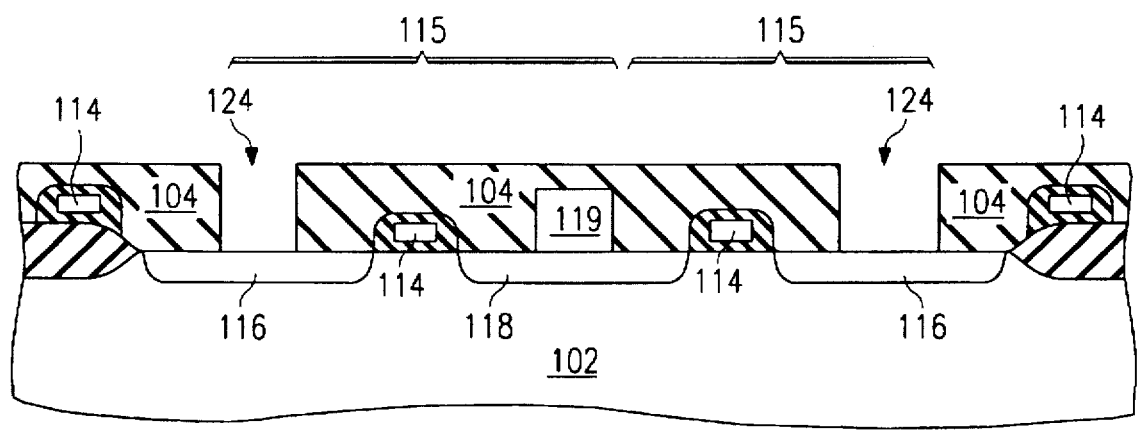
FIG. 3 is a cross-sectional view of a pair of DRAM cells prior to the formation of a storage node.

FIG. 3 illustrates a pair of DRAM cells prior to the formation of a storage capacitor. Wordlines 114 form the gates of transistors 115. Source/drain regions 116 and 118 are formed on opposites sides of wordlines 114. Bitline/bitline contact 119 contact source/drain region 118. Subsequently formed storage capacitors will connect to source/drain regions 116 through interlevel dielectric 104 in storage node contact areas 124. One method form forming such a pair of DRAM cells in described in co-pending U.S. application Ser. No. 08/670,079, filed Jun. 26,1996, assigned to Texas Instruments, Inc. and hereby incorporated by reference. Those skilled in the art will realize that the capacitor according to the invention may be used in conjunction with many other known methods for forming DRAM cells.

Figure 4:
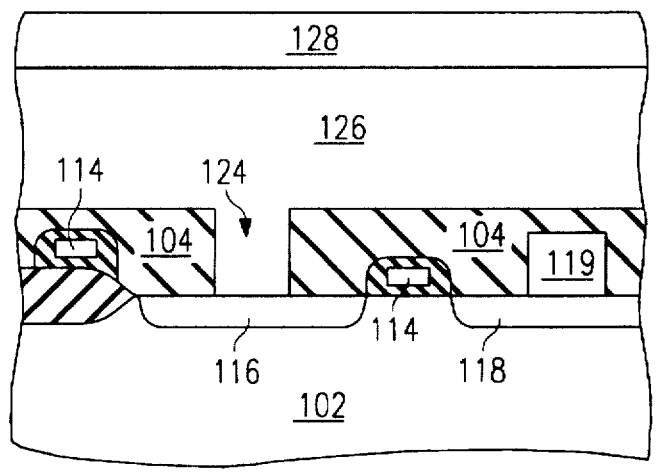
FIGS. 4–8 are cross-sectional views of the capacitor according to the invention at various stages of fabrication.

A method of forming the capacitor 100 according to the invention into the structure of FIG. 3 will now be described. First, a layer of polysilicon 126 is deposited over interlevel dielectric layer 104 and in storage node contact area 124, as shown in FIG. 4. Polysilicon 126 may directly contact source/drain region 116 or a plug (not shown) may be used in storage node contact area 124 to connect polysilicon 126 to source/drain region 116. Polysilicon layer 126 is preferably in-situ doped and deposited to a thickness on the order of 7000A Angstroms.

Figure 5:
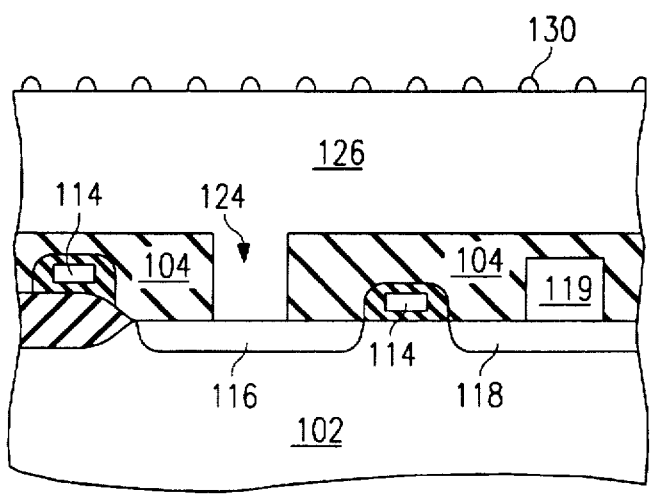

Next, a layer of photoresist 128 is deposited over polysilicon layer 126. The layer of photoresist 128 consists of a photosensitive resin containing a polymer. Preferably the polymer is a phenolic polymer mixed with or bound to a photosensitive compound such as diazoquine. However, any photoresist compatible with silylation is suitable. Then, without first exposing the photoresist layer 128 to light using a mask or reticle, the entire layer of photoresist 128 is subjected to a silylation process and etch using process conditions slightly varied from an optimized silylation process to create residue 130, as shown in FIG. 5. Silylation is the diffusion of silicon into the photoresist layer 130. For example, the layer of photoresist 128 may be treated with a silicon containing compound such as hexamethyldisilane for silylation. A gas state of the hexamethyldisilane is preferred although a liquid state may alternatively be used. Alternative silicon-containing compounds suitable for silylation will be apparent to those of ordinary skill in the art. A dry etch such as an oxygen plasma etch may then be then performed to remove the silylated photoresist layer 130. The process conditions are chosen such that a residue 130 remains after the dry etch.

For a conventional silylation process suitable ranges for the temperature and duration of the silylation process have been determined to achieve complete removal of the photoresist. However, by altering either or both of the above conditions, residue 130 may remain after the dry etch. Therefore, where a typical temperature may be on the order of 160° C., the embodiment of the invention may use a temperature greater than 160° C. (i.e., 160°–200° C.). Those of ordinary skill in the art will realize that other methods may be used to create the residue 130, such as varying etch conditions (i.e., using plasmas containing gases other than oxygen).

Figure 6:
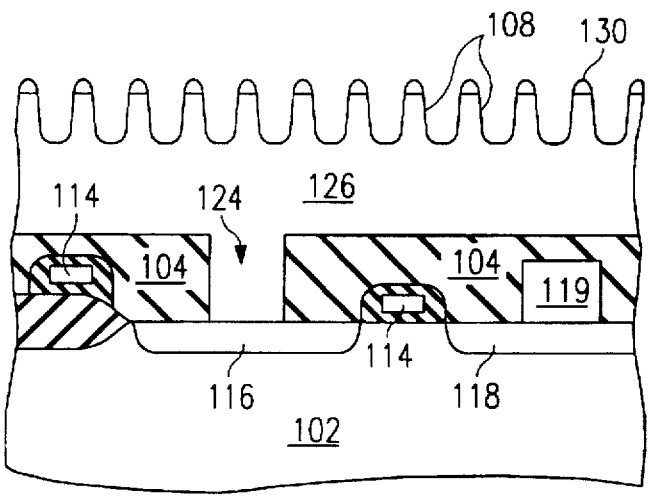

After creating residue 130, polysilicon layer 126 is etched using a conventional etch such as $SF_6/Cl_2/HBr$, as shown in FIG. 6. Residue 130 serves as a mask for the etch creating a rough surface on polysilicon layer 126. Peaks 108 of polysilicon layer 126 extend above the surface creating the rough surface. The extent to which peaks 108 extend above the surface may vary by design, but may be in the range of 100 nm. A spacing between peaks in the range of 100 nm is desirable. The height and spacing of peaks 108 is limited by the ability to later form a capacitor dielectric evenly across the surface including on the vertical sides of peaks 108. Residue 130 is then removed using a conventional oxygen plasma and chemical cleanup process.

Figure 7:
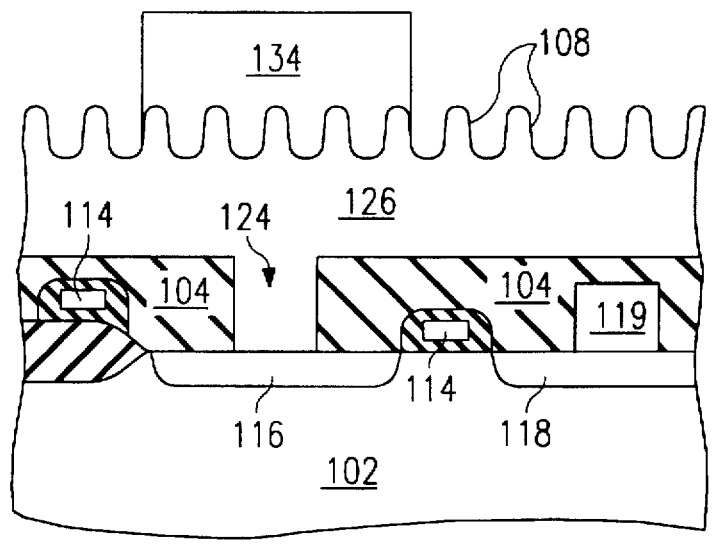
Figure 8:
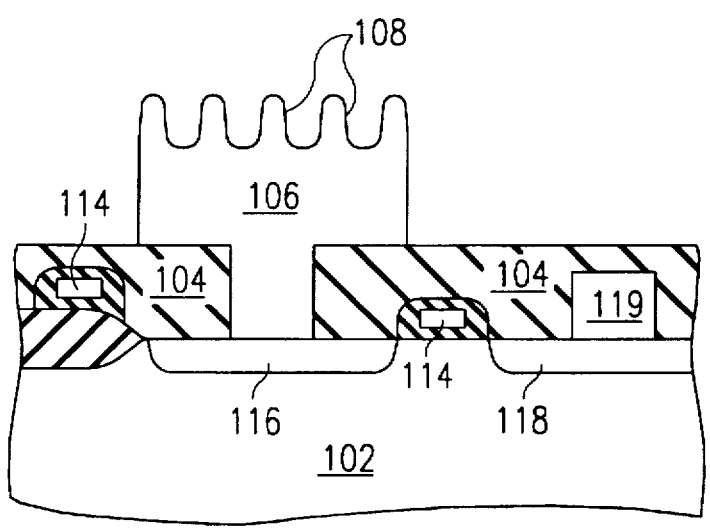

Next, a second layer of photoresist is deposited over the structure. A pattern 134 is created with the photoresist layer in the conventional manner (i.e., exposure to light through a reticle, silylation and etch). As shown in FIG. 7, the pattern 134 created covers the area of polysilicon layer 126 where the storage node 106 is to be formed. An etch, for example $SF_6/Cl_2/HBr$, is then performed to create storage node 106, as shown in FIG. 8. Pattern 134 is then removed.

The structure is completed by forming the capacitor dielectric 110, for example and a nitride/oxide bilayer, and a top node 112 of the storage capacitor 100. The top node 112 of the storage capacitor 100 preferably comprises doped polysilicon. The increased surface area caused by peaks 108 of storage node 106 yield an increase in capacitance for a given surface area of the device. Thus, each cell of a DRAM array may be fabricated in a smaller area reducing the size of the overall device. Moreover, the increase in capacitance is obtained using a relatively simple process.

While this invention has been described with reference to illustrative embodiments, this description is not intended to be construed in a limiting sense. Various modifications and combinations of the illustrative embodiments, such as other methods for forming residue 130, as well as other embodiments of the invention, will be apparent to persons skilled in the art upon reference to the description. It is therefore intended that the appended claims encompass any such modifications or embodiments.

What is claimed is:

1. A method for forming a capacitor on a structure comprising the steps of:

depositing a layer of polysilicon over said structure;

depositing a layer of photoresist comprising a material compatible with silylation over said layer of polysilicon;

without exposing said layer of photoresist to a reticle, exposing said layer of photoresist to a silicon-containing compound to silylate said layer of photoresist; and dry etching said layer of photoresist after said silylating step such that a layer of photoresist remnants remains on said layer of polysilicon;

etching said layer of polysilicon using said layer of photoresist remnants as a masking layer to form peaks in said polysilicon layer;

removing said photoresist remnants layer;

patterning and etching said layer of polysilicon to create a storage node having said peaks;

forming a capacitor dielectric layer over said storage node; and forming a top conductive node over said capacitor dielectric.

2. The method of claim 1, wherein said exposing step occurs at a temperature in the range of 160°–200° C.

3. The method of claim 1, wherein said exposing step occurs for a duration in the range of 0.1–5 minutes.

4. The method of claim 1, wherein said dry etching step comprises an oxygen plasma etch.

5. The method of claim 1, wherein said silicon-containing compound comprises hexamethyldisilane.

6. The method of claim 1, wherein said peaks have a height on the order of 100 nm.

7. The method of claim 1 wherein said layer of photoresist comprises a photosensitive resin containing a polymer.

8. A method for forming a capacitor on a structure comprising the steps of:

depositing a layer of polysilicon over said structure;

depositing a layer of photoresist over said layer of polysilicon;

without exposing said layer of photoresist to light through a reticle, treating said layer of photoresist with a silicon-containing compound;

dry etching said layer of photoresist such that a layer of remnants remains on said layer of polysilicon;

etching said layer of polysilicon using said layer of remnants as a masking layer to form peaks in said polysilicon layer;

removing said remnants layer;

patterning and etching said layer of polysilicon to create a storage node having said peaks;

forming a capacitor dielectric layer over said storage node; and forming a top conductive node over said capacitor dielectric.

9. The method of claim 8, wherein said treating step occurs at a temperature in the range of 160°–200° C.

10. The method of claim 8, wherein said treating step occurs for a duration in the range of 0.1–5 minutes.

11. The method of claim 8, wherein said dry etching step comprises an oxygen plasma etch.

12. The method of claim 8 wherein said silicon-containing compound comprises hexamethyldisilane.

13. The method of claim 8, wherein said peaks have a depth on the order of 100 nm.

14. The method of claim 8, wherein said layer of photoresist comprises a photosensitive resin containing a polymer.

* * * * *